US008431420B2

(12) United States Patent
Kobayashi et al.

(10) Patent No.: US 8,431,420 B2
(45) Date of Patent: Apr. 30, 2013

(54) MANUFACTURING METHOD OF ULTRASONIC PROBE AND ULTRASONIC PROBE

(75) Inventors: Takashi Kobayashi, Higashimurayama (JP); Shuntaro Machida, Kokubunji (JP)

(73) Assignee: Hitachi Medical Corporation, Tokyo (JP)

( * ) Notice: Subject to any disclaimer, the term of this patent is extended or adjusted under 35 U.S.C. 154(b) by 125 days.

(21) Appl. No.: 13/144,229

(22) PCT Filed: Jan. 6, 2010

(86) PCT No.: PCT/JP2010/050068

§ 371 (c)(1), (2), (4) Date: Jul. 12, 2011

(87) PCT Pub. No.: WO2010/082519

PCT Pub. Date: Jul. 22, 2010

(65) Prior Publication Data

US 2011/0272693 A1 Nov. 10, 2011

(30) Foreign Application Priority Data

Jan. 16, 2009 (JP) ................................ 2009-007568

(51) Int. Cl.
*H01L 21/66* (2006.01)

(52) U.S. Cl.
USPC ........................................................... 438/16

(58) Field of Classification Search ..................... 438/16
See application file for complete search history.

(56) References Cited

U.S. PATENT DOCUMENTS 6,271,620 B1 8/2001 Ladabaum
7,754,595 B2 * 7/2010 Enomoto et al. .............. 438/597
8,119,426 B2 * 2/2012 Kobayashi et al. ............ 438/14
2006/0145059 A1 7/2006 Lee et al.
2008/0001239 A1 1/2008 Enomoto et al.
2008/0067895 A1 3/2008 Adachi et al.
2008/0259733 A1 10/2008 Machida et al.
2008/0274576 A1 11/2008 Enomoto et al.
2008/0277661 A1 11/2008 Machida et al.
2008/0283945 A1 11/2008 Kobayashi et al.

FOREIGN PATENT DOCUMENTS

| | | |
|---|---|---|
| JP | 2006-333952 | 12/2006 |
| JP | 2006-343315 | 12/2006 |
| JP | 2006-352808 | 12/2006 |
| JP | 2008-518553 | 5/2008 |
| WO | 2007/005036 | 1/2007 |

OTHER PUBLICATIONS

International Search Report and Written Opinion from PCT International Application No. PCT/JP2010/050068, Jan. 6, 2010.

* cited by examiner

*Primary Examiner* — Charles Garber
*Assistant Examiner* — Andre' C Stevenson
(74) *Attorney, Agent, or Firm* — Brundidge & Stanger, P.C.

(57) ABSTRACT

The manufacturing yield of semiconductor devices (CMUTs) is improved. Before a polyimide film serving as a protective film is formed, a membrane is repeatedly vibrated to evaluate the breakdown voltage between an upper electrode and a lower electrode, and the upper electrode of a defective CMUT cell whose breakdown voltage between the upper electrode and the lower electrode is reduced due to the repeated vibrations of the membrane is removed in advance to cut off the electrical connection with other normal CMUT cells. By this means, in a block RB or a channel RCH including the recovered CMUT cell RC, reduction in the breakdown voltage between the upper electrode and the lower electrode after the repeated vibrations of the membrane is prevented.

15 Claims, 17 Drawing Sheets

MANUFACTURING METHOD OF ULTRASONIC PROBE AND ULTRASONIC PROBE

TECHNICAL FIELD

The present invention relates to a technique effectively applied to, for example, a manufacturing method of an ultrasonic probe (ultrasonic transducer) and an ultrasonic probe.

BACKGROUND ART

An ultrasonic transducer is used in, for example, a diagnostic apparatus of tumors in the human body. Conventionally, an ultrasonic transducer using the vibration of a piezoelectric body has been mainly used. However, with the recent advancement of MEMS (Micro Electro Mechanical System) techniques, a capacitance detecting ultrasonic transducer (Capacitive Micromachined Ultrasonic Transducer: CMUT) in which a vibrating part having the structure in which a cavity is sandwiched between upper and lower layer electrodes is formed on a silicon substrate has been currently developed.

Compared with the ultrasonic transducer using the piezoelectric body, the CMUT has advantages such as wide usable ultrasonic frequency range and high resolution. Moreover, since the CMUT is manufactured by using LSI (Large Scale Integration) processing techniques, microfabrication thereof is possible. Therefore, the CMUT is particularly suitable for the case where one ultrasonic element is arranged in an array and the row or the column thereof is controlled or the case where both of them are controlled. In addition, since the ultrasonic element is formed on a Si (Silicon) substrate like a normal LSI, the CMUT has another advantage that a signal processing circuit for transmitting/receiving ultrasonic waves can be mounted together on one semiconductor chip.

Techniques relating to the CMUT are disclosed in, for example, U.S. Pat. No. 6,271,620 B1 (Patent Document 1).

Moreover, Japanese Unexamined Patent Application Publication No. 2006-333952 (Patent Document 2) discloses a method in which, when a short-circuited CMUT cell is detected, only the upper electrode channel of a normal CMUT cell group is connected to signal input/output lines without connecting the upper electrode channel that includes the defective CMUT cell to the signal input/output lines.

Japanese Unexamined Patent Application Publication No. 2006-343315 (Patent Document 3) discloses a method in which an upper electrode part (spoke) connecting mutually-adjacent CMUT cells to each other serves as a fuse, the fuse is cut off by a large current that flows when the CMUT cell is short-circuited, and the electrical connection to the short-circuited CMUT cell is stopped, thereby removing only the short-circuited CMUT cell.

PRIOR ART DOCUMENTS

Patent Documents

Patent Document 1: U.S. Pat. No. 6,271,620 B1

Patent Document 2: Japanese Unexamined Patent Application Publication No. 2006-333952

Patent Document 3: Japanese Unexamined Patent Application Publication No. 2006-343315

SUMMARY OF THE INVENTION

Problems to be Solved by the Invention

According to the studies by the inventors of the present invention, it has been found out that the CMUT has various technical problems described below.

The basic structure and operation of a CMUT studied by the inventors of the present invention will be described with reference to FIG. 14 to FIG. 17. FIG. 14 is a cross-sectional view of a main part of one ultrasonic element (hereinafter, referred to as a CMUT cell) constituting the CMUT studied by the inventors of the present invention, FIG. 15 is a plan view of a main part showing the entirety of a semiconductor chip mounted with the CMUT studied by the inventors of the present invention, and FIG. 16 and FIG. 17 are plan views of a main part showing part of a CMUT cell array region studied by the inventors of the present invention in an enlarged manner.

As shown in FIG. 14, a lower electrode M1 of a CMUT cell is formed on a first insulating film 12 formed on a surface of a semiconductor substrate 11. A cavity part 15 is formed above the lower electrode M1 via a second insulating film 14, a third insulating film 16 is formed so as to surround the cavity part 15, and an upper electrode M2 is formed on the third insulating film 16. Moreover, a fourth insulating film 18, a fifth insulating film 19 and a polyimide film 21 are sequentially formed above the upper electrode M2.

A pad opening part (illustration omitted) reaching the lower electrode M1 is formed in the second insulating film 14, the third insulating film 16, the fourth insulating film 18, the fifth insulating film 19 and the polyimide film 21 in the region in which the cavity part 15 and the upper electrode M2 are not formed, and a voltage can be supplied to the lower electrode M1 through the pad opening part. Also, a pad opening part (illustration omitted) reaching the upper electrode M2 is formed in the fourth insulating film 18, the fifth insulating film 19 and the polyimide film 21, and a voltage can be supplied to the upper electrode M2 through the pad opening part. A membrane M which vibrates when the CMUT drives is made up of the third insulating film 16, the upper electrode M2 and the fourth and fifth insulating films 18 and 19 above the upper electrode M2.

Next, an operation of generating and transmitting ultrasonic waves will be described. When an AC voltage and a DC voltage are superimposed between the upper electrode M2 and the lower electrode M1, an electrostatic force works between the upper electrode M2 and the lower electrode M1, and the membrane M is vibrated by the frequency of the applied AC voltage, thereby generating ultrasonic waves.

On the other hand, when ultrasonic waves are to be received, the membrane M is vibrated by the pressure of the ultrasonic waves which have reached the surface of the membrane M. Since the distance between the upper electrode M2 and the lower electrode M1 is changed by the vibration, the ultrasonic waves can be detected as a change in the electric capacitance between the upper electrode M2 and the lower electrode M1. More specifically, when the distance between the upper electrode M2 and the lower electrode M1 is changed, the electric capacitance between the upper electrode M2 and the lower electrode M1 is changed, and a current flows. The ultrasonic waves can be detected by detecting the current.

As shown in FIG. 15 and FIG. 16, in the CMUT, a predetermined number of CMUT cells C are disposed in an array in a first direction X and a second direction Y orthogonal to the first direction, thereby constituting a unit called block B. Furthermore, a predetermined number of blocks B are disposed in an array in the first direction X and the second direction Y (CMUT cell array region CA), thereby constituting one semiconductor chip 1. The length of the semiconductor chip 1 in the longitudinal direction (second direction Y) is determined by the number of the upper electrodes M2 and the pitch d of the blocks B. The pitch d is, for example, approximately half of the wavelength λ of the transmitting sound of the CMUT cell C.

In order to suppress the area of the semiconductor chip 1 to a small area while ensuring a sufficient transmitting sound pressure, the planar shape of the CMUT cell C is hexagonal, and the CMUT cells C are arranged like a honeycomb in order to dispose the CMUT cells in high density. In the case where the CMUT is used for the diagnosis of part comparatively close to the body surface such as the carotid artery or the thyroid, a frequency region of, for example, about 5 to 10 MHz is used. In this case, the diameter of the incircle of the hexagonal CMUT cell C is, for example, about 50 μm. Four of the cells are disposed in the longitudinal direction (second direction Y) and eight of the cells are disposed in the transverse direction (first direction X), thereby constituting one block B (in FIG. 16, the number of the cells in one block B is displayed as 4×4 for simplification). The semiconductor chip 1 is constituted by disposing 192 blocks in the second direction Y and 16 blocks in the first direction X. Note that, in some cases, a unit in which 16 blocks B are arranged in the first direction X is referred to as an upper electrode channel, and a unit in which 192 blocks B are arranged in the second direction Y is referred to as a lower electrode channel. In the upper electrode channel, 4×8×16=512 CMUT cells C are present. The area of the semiconductor chip 1 is, for example, 4 cm×1 cm.

In the CMUT, the transmission/reception sensitivity of ultrasonic waves is desired to be high. In order to increase the transmission/reception sensitivity of ultrasonic waves, when viewed in terms of transmission, it is necessary to obtain a high transmitting sound pressure by increasing the amplitude of vibration of the membrane M. In the membrane M vibrated by the voltage applied between the upper electrode M2 and the lower electrode M1 shown in FIG. 14 described above, the transmitting sound pressure is increased as the applied voltage is increased. More specifically, in order to increase the transmitting sound pressure, for example, in the case where the shape of the membrane M is a hexagonal shape inscribed in a circle having a diameter of 50 μm, each of the second insulating film 14 and the third insulating film 16 has a thickness of 0.2 μm and the cavity part 15 has a thickness of 0.1 μm, a high voltage of 100 V or higher has to be applied between the upper electrode M2 and the lower electrode M1.

However, when the distance (gap) between the second insulating film 14 and the third insulating film 16 sandwiching the cavity part 15 in the case where a voltage is applied between the upper electrode M2 and the lower electrode M1 becomes about ⅔ of the distance (gap) between the second insulating film 14 and the third insulating film 16 sandwiching the cavity part 15 in the case where no voltage is applied between the upper electrode M2 and the lower electrode M1, the membrane M is operated like that the second insulating film 14 and the third insulating film 16 are brought into contact with each other. This phenomenon is called collapse, and the voltage at which this contact occurs is called a collapse voltage.

According to the studies by the inventors of the present invention, it has been found out that, when the operation in which the second insulating film 14 and the third insulating film 16 are in contact with each other is carried out, the breakdown voltage of the second insulating film 14 or the third insulating film 16 is deteriorated in some part of the CMUT cells C. The conceivable causes of the reduction in the breakdown voltage include: for example, injection of electric charge from the lower electrode M1 or the upper electrode M2 into the second insulating film 14 or the third insulating film 16; formation of micro structural defects in the second insulating film 14 or the third insulating film 16 caused by the mechanical shock due to the contact between the second insulating film 14 and the third insulating film 16; and the combination of both of them. The contact between the second insulating film 14 and the third insulating film 16 like this is caused when the collapse voltage is fluctuated due to variations in the thickness of the cavity parts 15 among the CMUT cells C and variations in physical quantities such as the film thickness or the internal stress of the third insulating film 16, the upper electrode M2 and the fourth and fifth insulating films 18 and 19 constituting the membrane M and the polyimide film 21 above the upper electrode M2, and the contact is likely to occur in the CMUT cell C having a lower collapse voltage compared with the other CMUT cells C.

If the breakdown voltage of the second insulating film 14 or the third insulating film 16 becomes lower than the operating voltage of the ultrasonic transducer, insulation breakdown occurs in the CMUT cell C, and the part between the upper electrode M2 and the lower electrode M1 is short-circuited in the CMUT cell C in which the insulation breakdown has occurred. For example, if breakdown occurs in the CMUT cell Cb shown in FIG. 17, it becomes difficult to apply a desired voltage between the upper electrode M2 and the lower electrode M1 in the upper electrode channel CHA including the CMUT cell Cb, and diagnosis images are deteriorated. An ultrasonic transducer for a medical ultrasonic diagnostic apparatus needs a life of about several years, and the repeated operations of the membrane M of, for example, about $5\times10^{11}$ times have to be ensured. Therefore, it is necessary to restore the upper electrode channel CHA including the CMUT cell Cb in which insulation breakdown has occurred, or it is necessary to detect and remove the CMUT cell Cb in which insulation breakdown may occur before actual use.

In the CMUT described in Patent Document 2 above, only the upper electrode channel of the normal CMUT cell group is connected to the signal input/output lines without connecting the upper electrode channel including the defective CMUT cell to the signal input/output lines. However, the operation of the upper electrode channel including the defective CMUT cell becomes impossible, and ultrasonic waves cannot be transmitted/received in the part of the defective CMUT cell.

Also, in the CMUT described in Patent Document 3 above, the spoke is cut off by the large current that flows when the CMUT cell is short-circuited and the electrical connection to the short-circuited CMUT cell is stopped, thereby removing only the short-circuited CMUT cell. However, there is concern that the resistance of the spoke may be increased to increase the impedance thereof and the transmission/reception sensitivity may be reduced. Moreover, as conceivable problems, when insulation breakdown of the CMUT cell occurs, not only the spoke but also the upper electrode constituting the membrane of the CMUT cell and the insulating film above the upper electrode may be blown off or deformed, and a shielding metal layer disposed on an acoustic lens or an acoustic surface protective layer of the CMUT and the upper electrode may be brought into contact with each other to form a new short path, or peel-off at adhesive interfaces may occur.

An object of the present invention is to provide the technique capable of improving the manufacturing yield of semiconductor devices (CMUTs).

The above and other objects and novel characteristics of the present invention will be apparent from the description of the present specification and the accompanying drawings.

Means for Solving the Problems

The following is a brief description of an outline of the typical embodiment in the invention disclosed in the present application.

This embodiment is a manufacturing method of an ultrasonic probe for forming an ultrasonic probe mounted with a semiconductor device, in which an element having an upper electrode mechanically operated when a potential difference is applied between the upper electrode and a lower electrode disposed via a cavity part serves as one cell, blocks each including a predetermined number of the cells disposed in a first direction and a second direction orthogonal to the first direction are provided on a main surface of a semiconductor substrate, the upper electrodes of the plurality of cells constituting the blocks disposed in the first direction are electrically connected to each other, the lower electrodes of the plurality of cells constituting the blocks disposed in the second direction are electrically connected to each other, and the blocks are disposed in a matrix in the first direction and the second direction, and the manufacturing method includes: (a) a step of measuring a breakdown voltage between the upper electrode and the lower electrode after operating the upper electrode; (b) a step of removing the upper electrode of the cell determined to be defective in the step (a); and (c) a step of forming a protective film on the main surface of the semiconductor substrate after the step (b).

Effects of the Invention

The effects obtained by typical embodiments of the invention disclosed in the present application will be briefly described below.

The manufacturing yield of semiconductor devices (CMUTs) can be improved.

BRIEF DESCRIPTIONS OF THE DRAWINGS

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, in some drawings used in the embodiments, hatching is used even in a plan view so as to make the drawings easy to see. In the following embodiments, the term “wafer” mainly indicates a silicon (Si) single-crystal wafer and it indicates not only the same but also a silicon on insulator (SOI) wafer, an insulating film substrate for forming an integrated circuit thereon, or the like. The shape of the wafer includes not only a circular shape or a substantially circular shape but also a square shape, a rectangular shape, and the like.

Also, components having the same function are denoted by the same reference symbols throughout the drawings for describing the embodiments, and the repetitive description thereof will be omitted. The embodiments of the present invention will be described in detail below with reference to the drawings.

(First Embodiment)

A semiconductor device according to the first embodiment will be described with reference to FIG. 1 to FIG. 4. In the first embodiment, the case where the invention accomplished by the inventors of the present invention is applied to a CMUT manufactured by MEMS techniques which are the application field serving as the background of the invention will be described.

Figure 1:
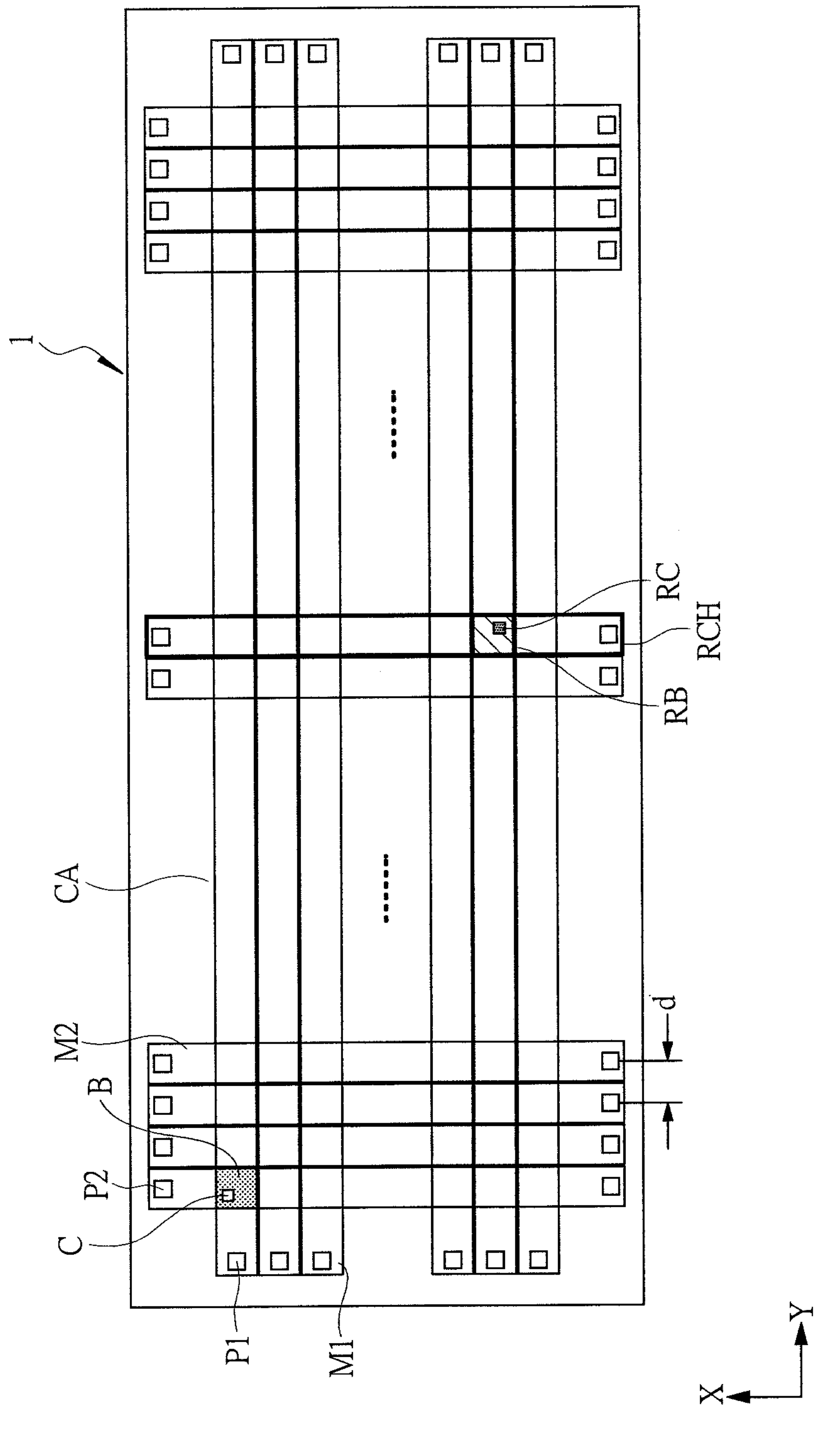
FIG. 1 is a plan view of a main part showing the entirety of a semiconductor chip mounted with a CMUT according to a first embodiment of the present invention.
Figure 2:
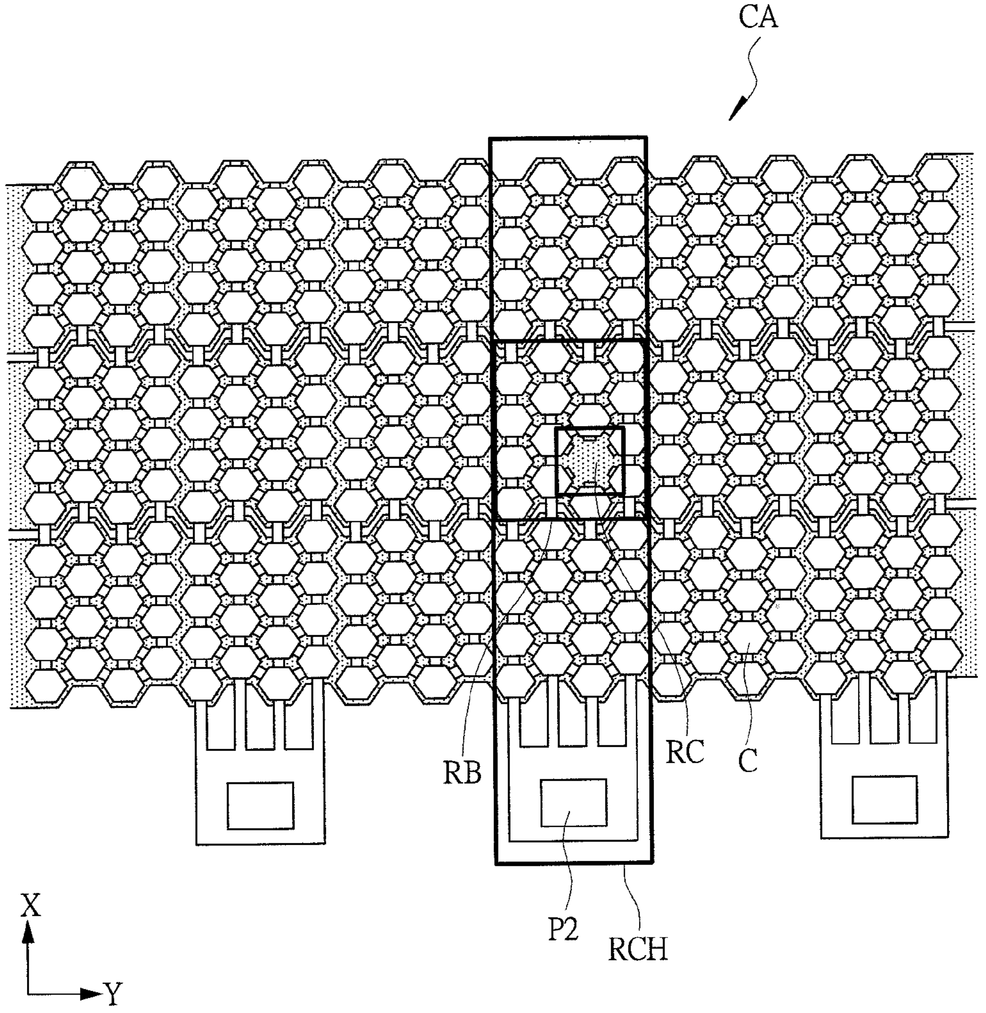
FIG. 2 is a plan view of a main part showing part of a CMUT cell array region according to the first embodiment of the present invention in an enlarged manner.
Figure 3:
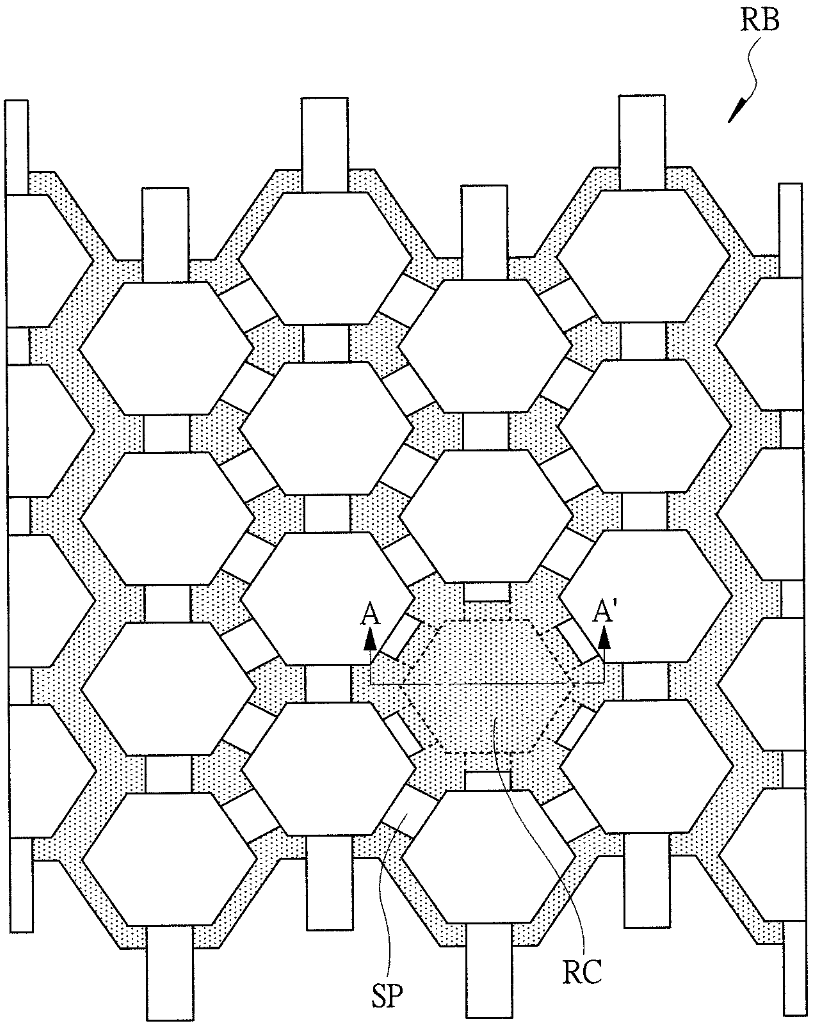
FIG. 3 is a plan view of a main part showing part of a block according to the first embodiment of the present invention in an enlarged manner.
Figure 4:
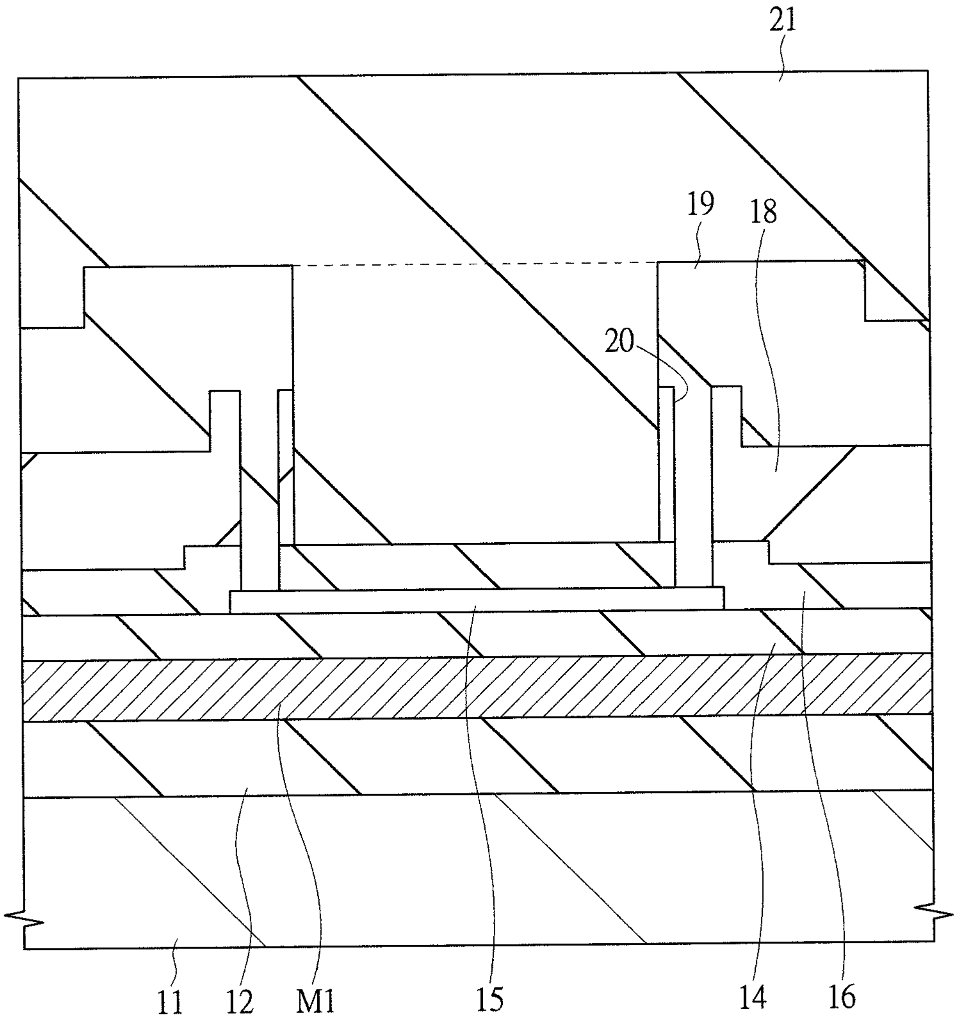
FIG. 4 is a cross-sectional view of a main part taken along the line A-A' of FIG. 3 according to the first embodiment of the present invention.

FIG. 1 is a plan view of a main part showing the entirety of a semiconductor chip mounted with a CMUT, FIG. 2 is a plan view of a main part showing part of a CMUT cell array region in an enlarged manner, FIG. 3 is a plan view of a main part showing part of a block in an enlarged manner, and FIG. 4 is a cross-sectional view of a main part taken along the line A-A' of FIG. 3.

As shown in FIG. 1, the planar shape of the semiconductor chip 1 is formed to be, for example, a rectangular shape. The longitudinal-direction (second direction Y) length of the semiconductor chip 1 is, for example, about 4 cm, and the transverse-direction (first direction X) length of the semiconductor chip 1 is, for example, about 1 cm. However, the planar dimensions of the semiconductor chip 1 are not limited thereto and various modifications can be made. For example, the longitudinal-direction (second direction Y) length may be about 8 cm, and the transverse-direction (first direction X) length may be about 1.5 cm.

In the CMUT cell array region CA, a plurality of lower electrodes M1, a plurality of upper electrodes M2 orthogonal thereto, and a plurality of CMUT cells (ultrasonic elements, vibrators, sensor cells) C are disposed.

The plurality of lower electrodes M1 are formed so as to extend in the longitudinal direction (second direction Y) of the semiconductor chip 1, and for example, 16 channels (hereinafter, also referred to as ch) are arranged in the transverse direction (first direction X) of the semiconductor chip 1.

Also, the plurality of lower electrodes M1 are electrically connected to pads P1. In the outer periphery of the CMUT cell array region CA and in the vicinities of the both ends of the semiconductor chip 1 in the longitudinal direction (second direction Y), the plurality of pads P1 are arranged in the transverse direction (first direction X) of the semiconductor chip 1 so as to correspond to the lower electrodes M1.

The plurality of upper electrodes M2 are formed so as to extend in the transverse direction (first direction X) of the semiconductor chip 1, and for example, 192 ch are arranged in the longitudinal direction (second direction Y) of the semiconductor chip 1.

Also, the plurality of upper electrodes M2 are electrically connected to pads P2. In the outer periphery of the CMUT cell array region CA and in the vicinities of the both ends of the semiconductor chip 1 in the transverse direction (first direction X), the plurality of pads P2 are arranged in the longitudinal direction (second direction Y) of the semiconductor chip 1 so as to correspond to the upper electrodes M2.

The CMUT cell C is composed of, for example, an electrostatic variable capacitor and is disposed at the intersecting point of the lower electrode M1 and the upper electrode M2. More specifically, the plurality of CMUT cells C are regularly arranged in a matrix (rows and columns, array) in the CMUT cell array region CA. In the CMUT cell array region CA, for example, 32 CMUT cells C are disposed at the intersecting point of the lower electrode M1 and the upper electrode M2. The unit of the 32 CMUT cells C is called a block B. Therefore, the CMUT cell array region CA is the region in which the plurality of CMUT cells Care formed, and the semiconductor chip 1 is a semiconductor device having the CMUT cell array region CA, in which the plurality of CMUT cells Care formed, on the main surface thereof.

An object of the present invention is to normally operate the CMUT cell array region CA as a whole, in other words, to make the semiconductor chip 1 into a proper product by discriminating a defective CMUT cell in the CMUT cell array region CA, removing the upper electrode M2 of the defective CMUT cell and electrically separating the defective cell from the rest of normal CMUT cells. The symbol RC of FIG. 1 denotes a recovered CMUT cell in which the upper electrode of the defective CMUT cell is removed, the symbol RB denotes a block including the recovered CMUT cell, and the symbol RCH denotes an upper electrode channel including the recovered CMUT cell.

FIG. 2 is a plan view of a main part showing the CMUT cell array region CA in the vicinity of the block RB including the recovered CMUT cell RC in an enlarged manner, and FIG. 3 is a plan view of a main part focusing on and showing the block RB including the recovered CMUT cell RC of FIG. 2. The upper electrode M2 of the defective CMUT cell is removed from the middle of spokes SP, which are provided for connecting the cell to adjacent CMUT cells C, and is completely eliminated. In other words, in the recovered CMUT cell RC, the part of the upper electrode M2 constituting the membrane is completely removed.

Figure 14:
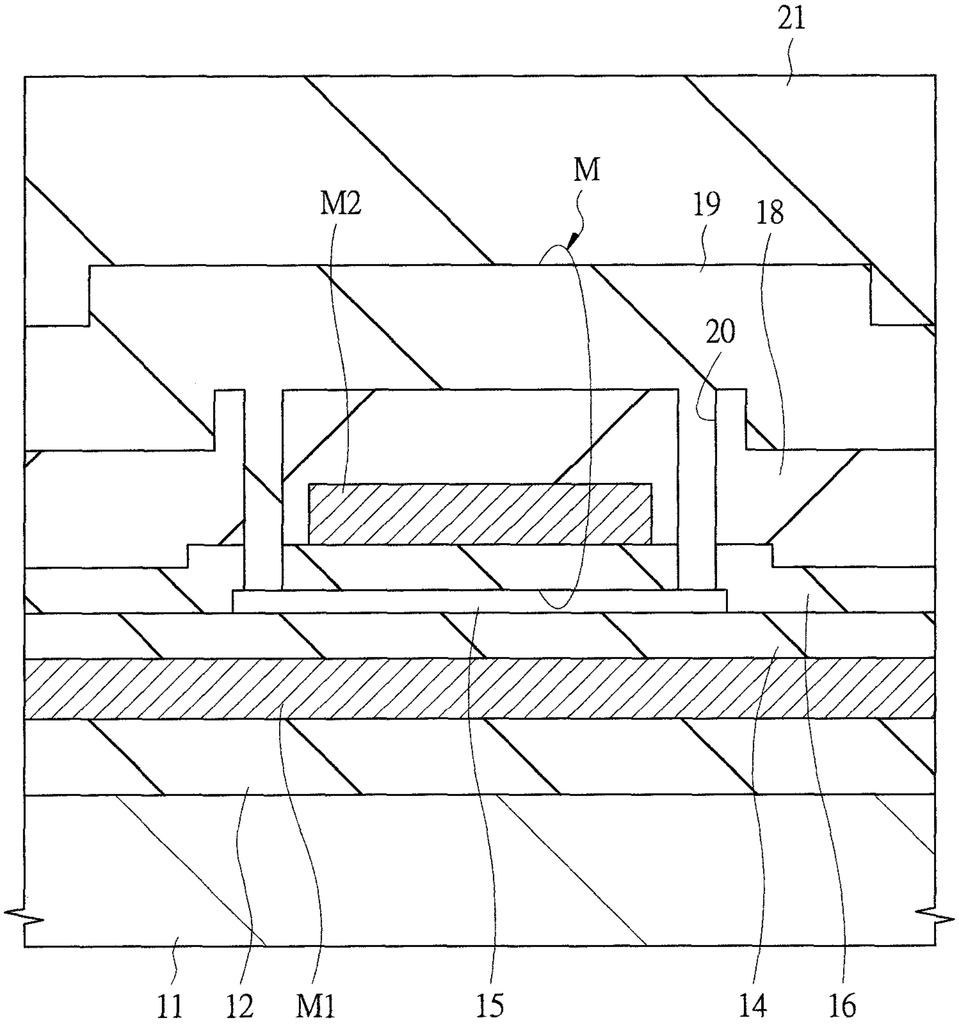
FIG. 14 is a cross-sectional view of a main part of one CMUT cell constituting a CMUT studied by the inventors of the present invention.
Figure 15:
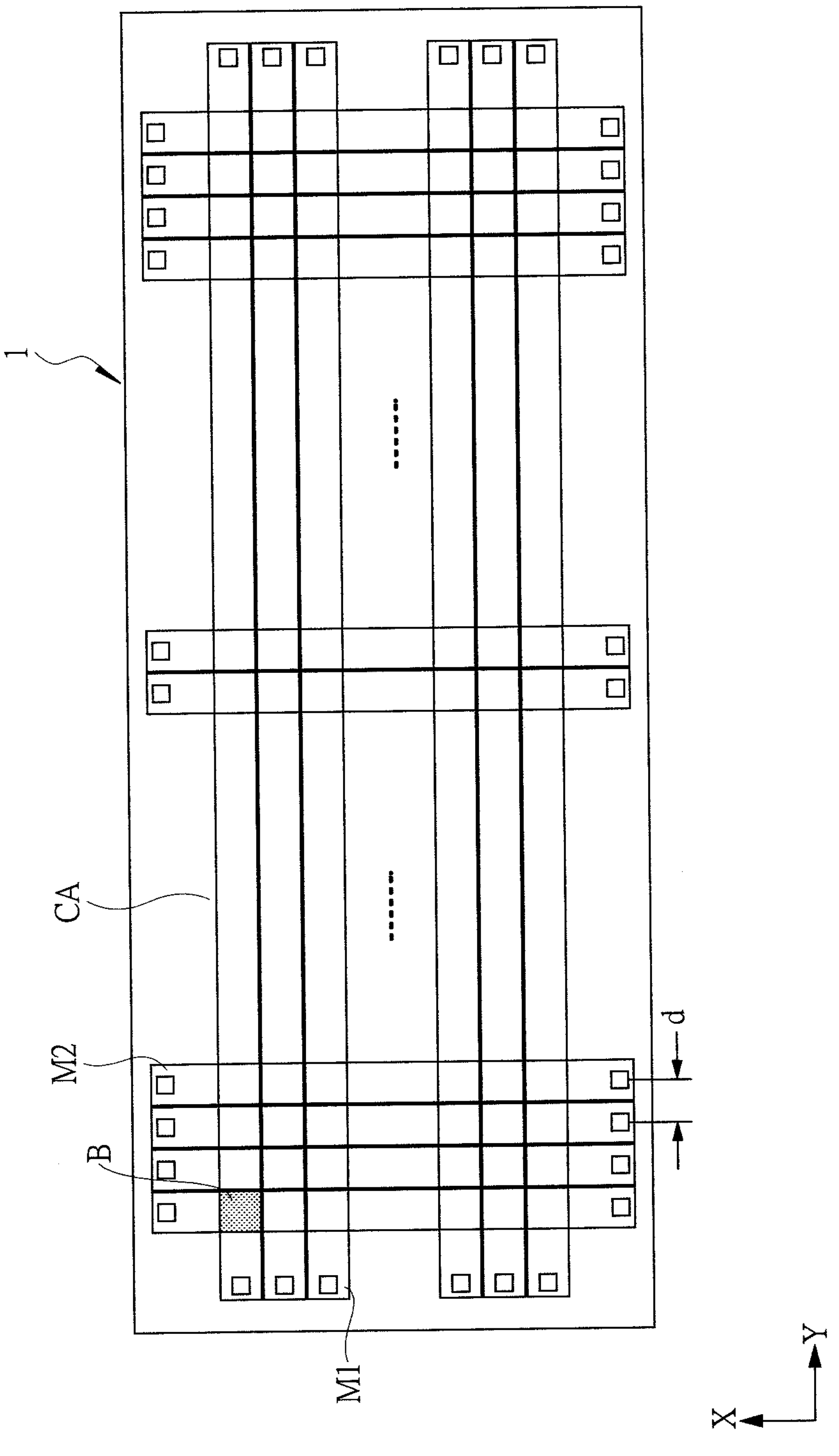
FIG. 15 is a plan view of a main part showing the entirety of a semiconductor chip mounted with the CMUT studied by the inventors of the present invention.
Figure 16:
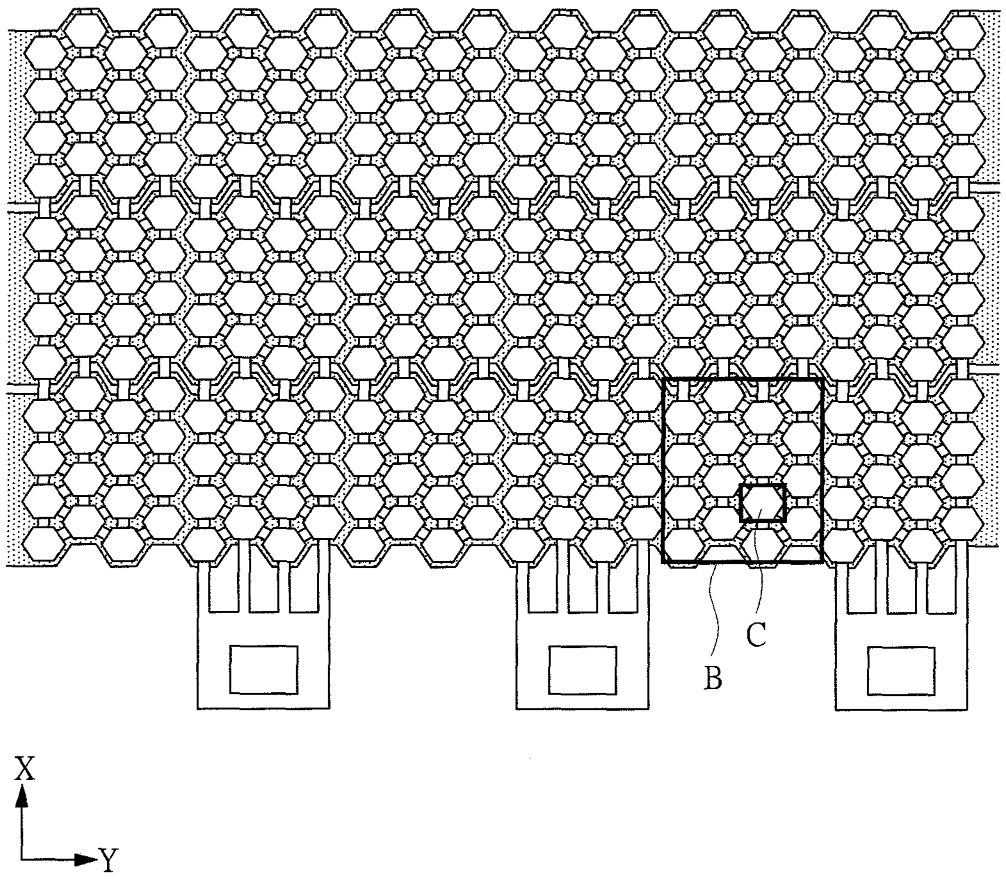
FIG. 16 is a plan view of a main part showing part of a CMUT cell array region studied by the inventors of the present invention in an enlarged manner.
Figure 17:
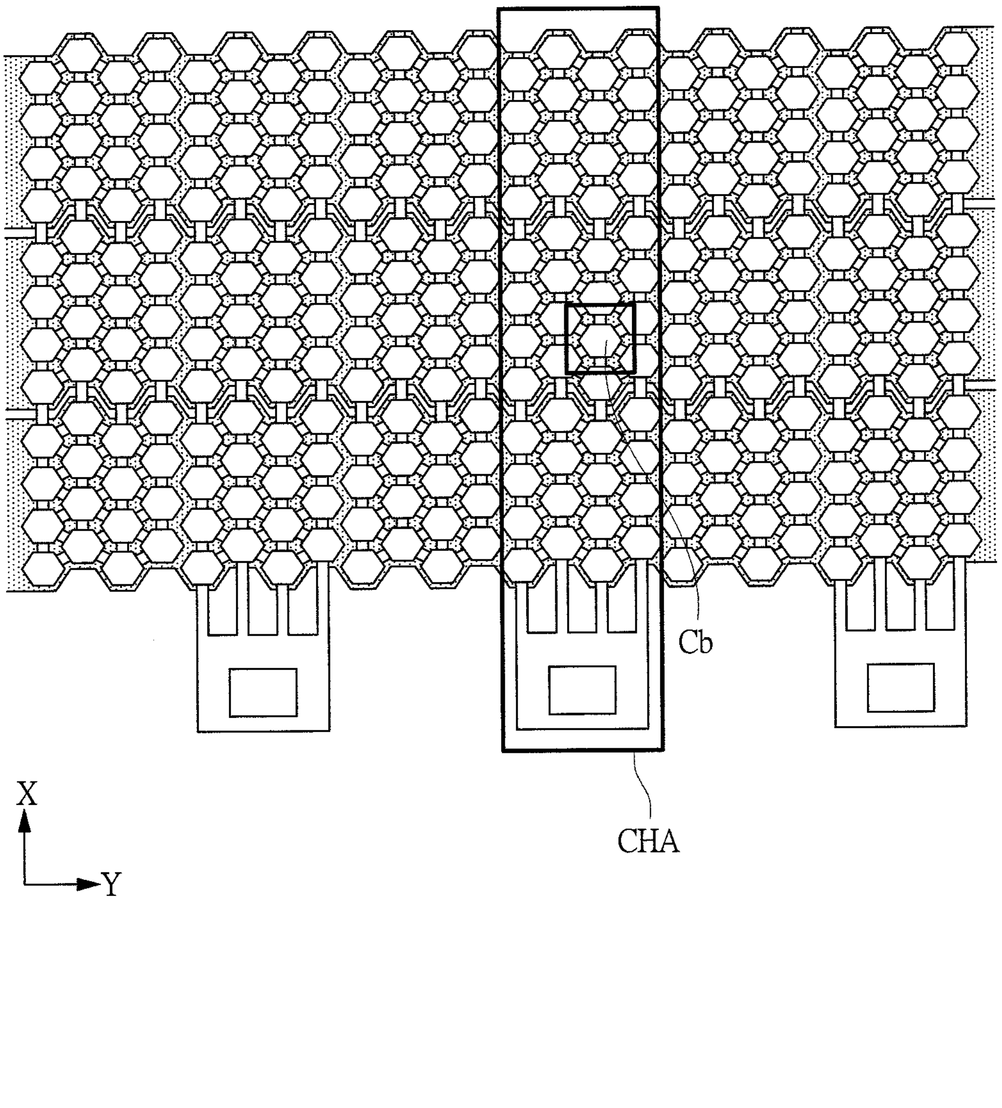
FIG. 17 is another plan view of a main part showing part of a CMUT cell array region studied by the inventors of the present invention in an enlarged manner.

FIG. 4 is a cross-sectional view of a main part showing the A-A' cross section of FIG. 3 in an enlarged manner. The upper electrode M2 constituting the membrane M, which is present in the normal CMUT cell C shown in FIG. 14 described above, the fourth insulating film 18 and the fifth insulating film 19 thereabove are removed, and the polyimide film 21 is filled in the recessed part from which these are removed.

Figure 5:
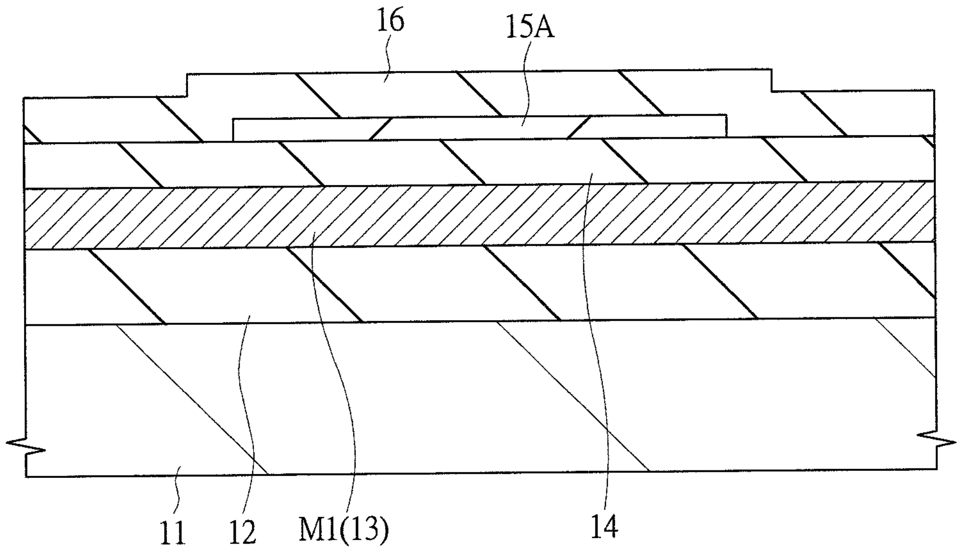
FIG. 5 is a cross-sectional view of a main part of a CMUT cell for describing a manufacturing process of the CMUT according to the first embodiment of the present invention.
Figure 6:
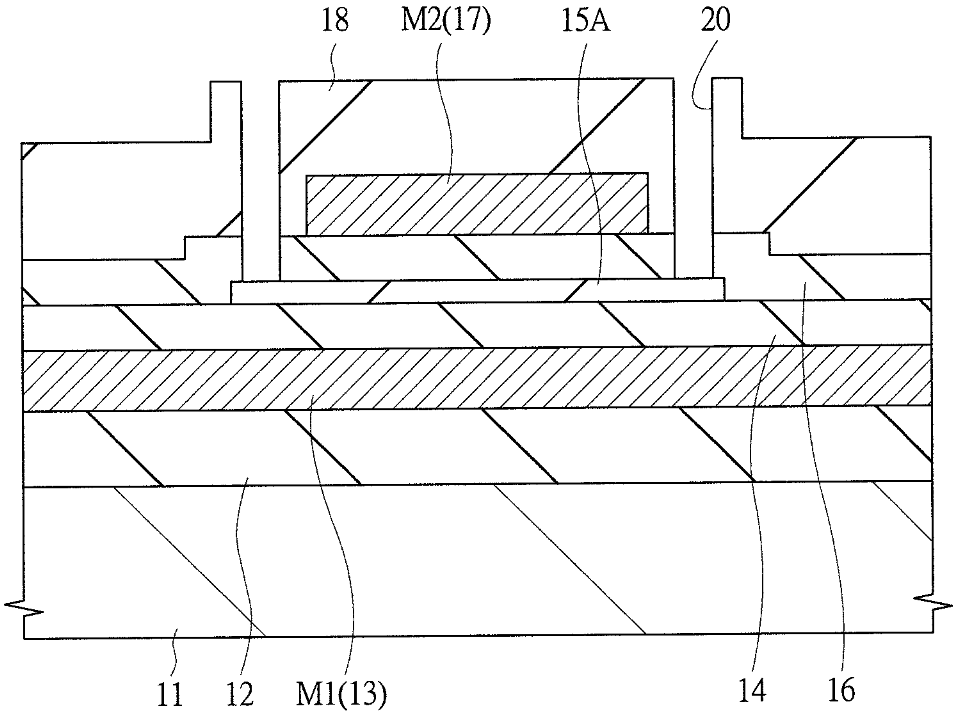
FIG. 6 is a cross-sectional view of a main part of a CMUT cell for describing the manufacturing process of the CMUT according to the first embodiment of the present invention.
Figure 7:
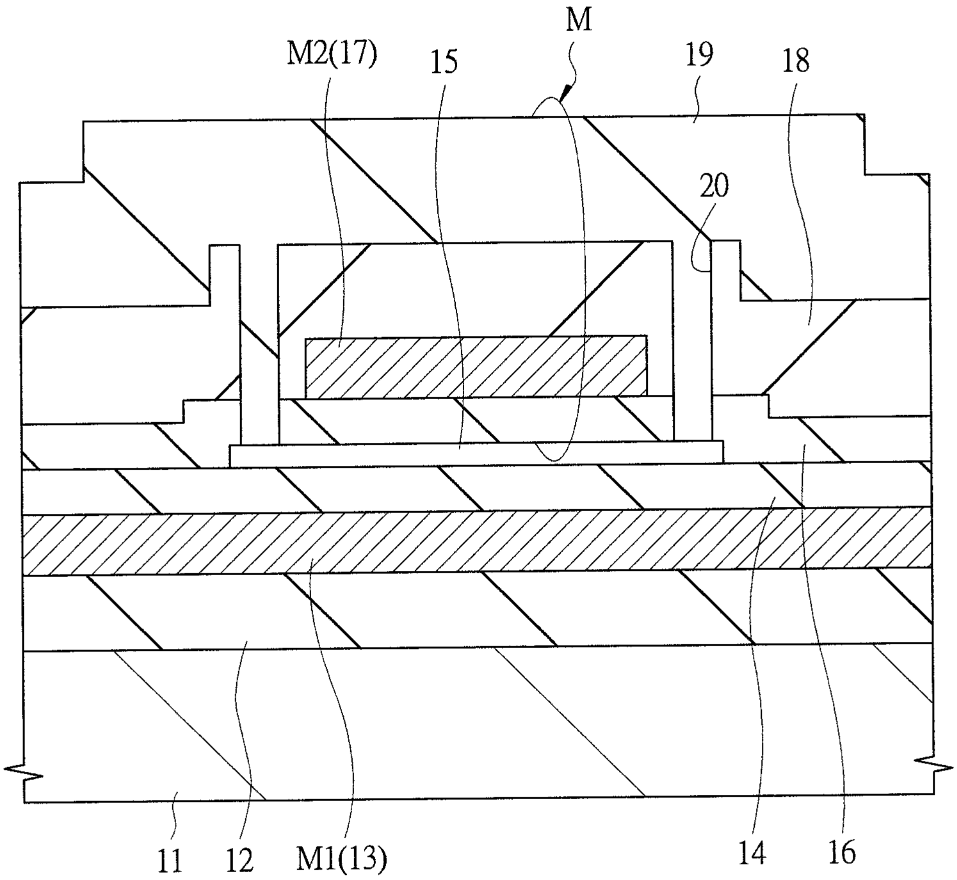
FIG. 7 is a cross-sectional view of a main part of a CMUT cell for describing the manufacturing process of the CMUT according to the first embodiment of the present invention.
Figure 8:
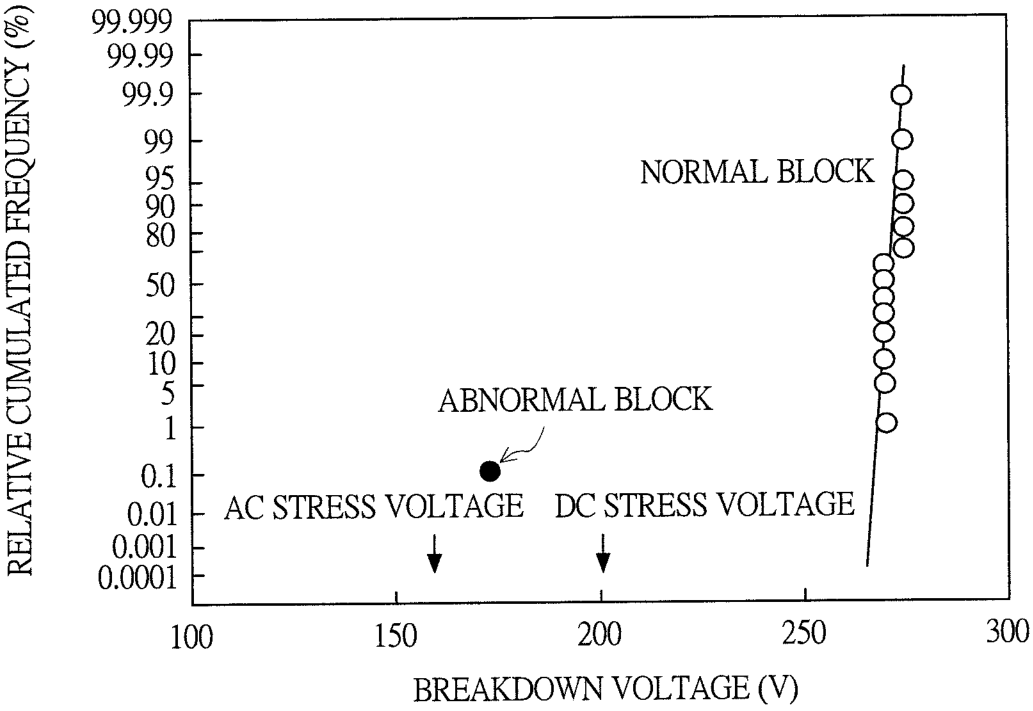
FIG. 8 is a graph chart showing an example of the breakdown characteristics of insulating films between an upper electrode and a lower electrode measured in a CMUT cell according to the first embodiment of the present invention.
Figure 9:
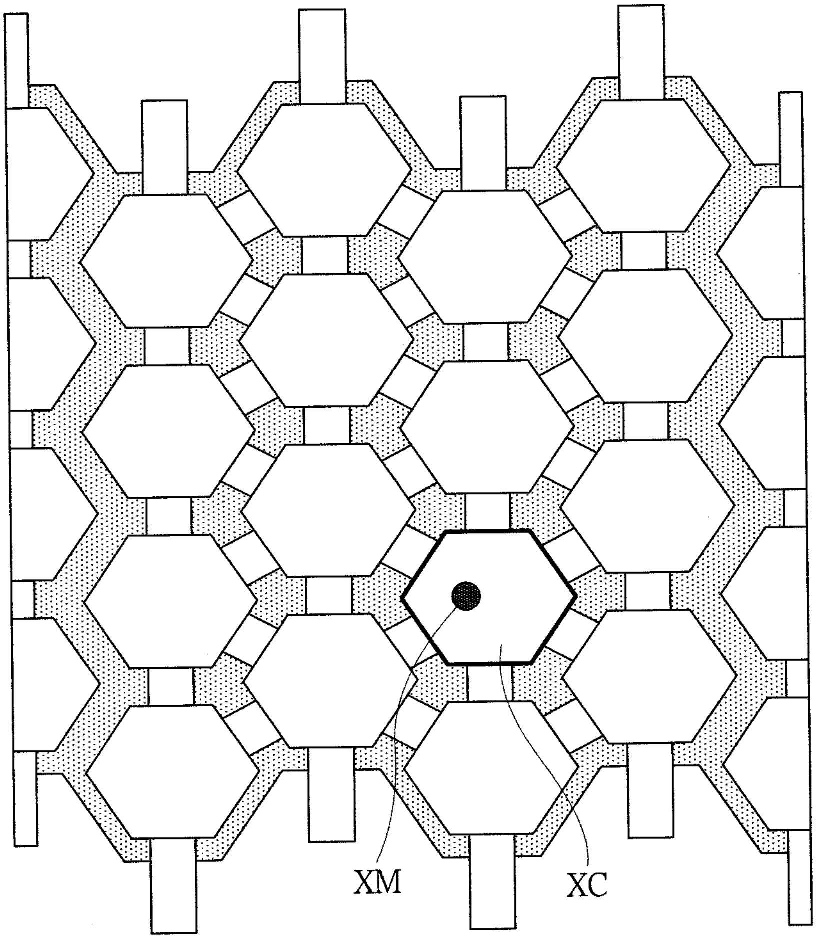
FIG. 9 is a plan view of a main part of the CMUT cell showing an appearance inspection result after a repeated vibration test of a membrane of a capacitance detecting ultrasonic transducer.
Figure 10:
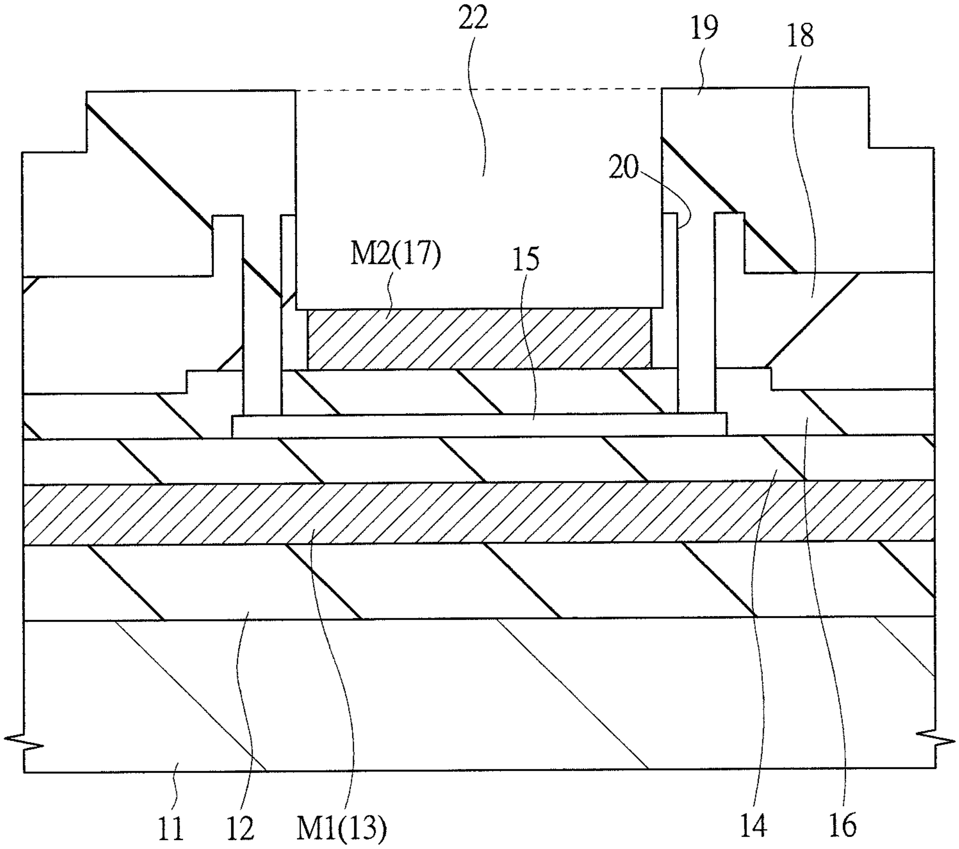
FIG. 10 is a cross-sectional view of a main part of a CMUT cell for describing the manufacturing process of the CMUT according to the first embodiment of the present invention.
Figure 11:
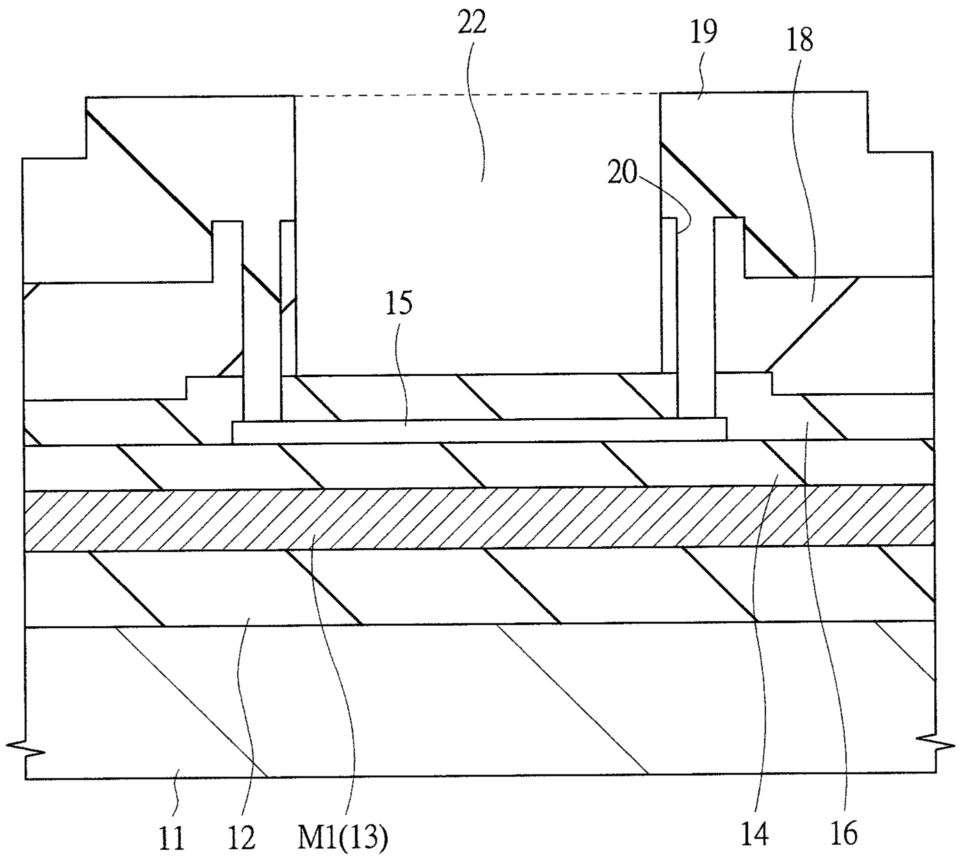
FIG. 11 is a cross-sectional view of a main part of a CMUT cell for describing the manufacturing process of the CMUT according to the first embodiment of the present invention.

Next, a manufacturing method of the CMUT cell according to the first embodiment will be described in the order of steps with reference to FIG. 5 to FIG. 11. FIG. 5 to FIG. 7 are cross-sectional views of a main part of the CMUT cell, FIG. 8 is a graph chart showing an example of the breakdown characteristics of insulating films between the upper electrode and the lower electrode measured in the CMUT cell, FIG. 9 is a plan view of a main part of a defective CMUT cell, and FIG. 10 and FIG. 11 are cross-sectional views of a main part of the defective CMUT cell.

First, as shown in FIG. 5, a semiconductor substrate (at this point, a semiconductor thin plate having an approximately circular planar shape called a semiconductor wafer) 11 is prepared. The semiconductor substrate 11 is made of, for example, single crystal silicon. Subsequently, a first insulating film 12 made of, for example, a silicon oxide film is formed on the entire main surface of the semiconductor substrate 11. The thickness of the first insulating film 12 can be, for example, 0.8 μm.

Next, a conductor film 13 for forming a lower electrode is formed on the first insulating film 12. The conductor film 13 is formed on the entire main surface of the semiconductor substrate 11. The conductor film 13 is made of a metal film or a film exhibiting metallic electrical conduction and is made of, for example, a stacked film of a titanium nitride film, an aluminum film and a titanium nitride film formed in this order from below. This aluminum film is made of a conductive film containing aluminum as a main component such as an aluminum single film or an aluminum alloy film. The conductor film 13 can be formed by using, for example, a sputtering method. When the conductor film 13 is the stacked film of a titanium nitride film, an aluminum film and a titanium nitride film, the aluminum film serves as a main conductor film of the lower electrode M1, and therefore, the thickness of the aluminum film is larger than the thickness of the titanium nitride films. For example, the thickness of the aluminum film can be about 0.6 μm, and the thickness of each of the titanium nitride films above and below the aluminum film can be about 0.05 μm. Also, a stacked film of a titanium film and a titanium nitride film or a tungsten film can be used instead of the titanium nitride film.

Next, the conductor film 13 is patterned by using, for example, a lithography method and a dry etching method. The lower electrode M1 is formed by the patterned conductor film 13. Subsequently, an insulating film (illustration omitted) such as a silicon oxide film is formed on the entire main surface of the semiconductor substrate 11 by, for example, a plasma chemical vapor deposition (CVD) method so as to cover the lower electrode M1. In this process, the insulating film is deposited so as to have the thickness by which the space between the mutually-adjacent lower electrodes M1 can be sufficiently filled with the insulating film. Next, the insulating film on the surface of the lower electrode M1 is removed by, for example, a chemical mechanical polishing (CMP) method or an etch back method so as to expose the surface of the lower electrode M1 and cause the insulating film to remain between the mutually-adjacent lower electrodes M1.

Next, a second insulating film 14 is formed on the entire main surface of the semiconductor substrate 11 (that is, on the lower electrode M1 and on the insulating film between the mutually-adjacent lower electrodes M1). For example, a silicon oxide film, a silicon nitride film or a stacked film thereof formed by the plasma CVD method is used as the second insulating film 14. When a high-melting-point metal such as tungsten, a polycrystalline silicon film or the like is used as the lower electrode M1, a LPCVD method capable of forming a denser film compared with the plasma CVD method may be used.

Next, a sacrifice film (illustration omitted) made of, for example, an amorphous silicon film is formed on the entire main surface of the semiconductor substrate 11 (in other words, on the second insulating film 14) by using, for example, the plasma CVD method. The sacrifice film is patterned by using, for example, the lithography method and the dry etching method, thereby forming a sacrifice film pattern (sacrifice film pattern for forming a cavity part) 15A. The sacrifice film pattern 15A is formed above the lower electrode M1 via the second insulating film 14. The sacrifice film pattern 15A is a pattern for forming the cavity part 15, and the planar shape of the sacrifice film pattern 15A is formed to have the same planar shape as the cavity part 15. Therefore, the sacrifice film pattern 15A is formed in the reserved region in which the cavity part 15 is to be formed.

Next, a third insulating film 16 is formed on the entire main surface of the semiconductor substrate 11 so as to cover the surface of the sacrifice film pattern 15A. For example, a silicon oxide film, a silicon nitride film or a stacked film thereof formed by the plasma CVD method can be used as the third insulating film 16 like the second insulating film 14.

Next, as shown in FIG. 6, a conductor film 17 for forming the upper electrode is formed on the third insulating film 16. The conductor film 17 is formed on the entire main surface of the semiconductor substrate 11. The conductor film 17 is made of a metal film or a film exhibiting metallic electrical conduction and is made of, for example, a stacked film of a titanium nitride film, an aluminum film and a titanium nitride film formed in this order from below. This aluminum film is made of a conductive film containing aluminum as a main component such as an aluminum single film or an aluminum alloy film. The conductor film 17 can be formed by using, for example, the sputtering method. Also, the thickness of the conductor film 17 for forming the upper electrode is smaller than the thickness of the conductor film 13 for forming the lower electrode and can be, for example, about 0.4 μm. When the conductor film 17 is the stacked film of a titanium nitride film, an aluminum film and a titanium nitride film, the aluminum film serves as a main conductor film of the upper electrode M2, and therefore, the thickness of the aluminum film is larger than the thickness of the titanium nitride films. For example, the thickness of the aluminum film can be about 0.3 μm, and the thickness of each of the titanium nitride films above and below the aluminum film can be about 0.05 μm. Also, a stacked film of a titanium film and a titanium nitride film or a tungsten film can be used instead of the titanium nitride film.

Next, the conductor film 17 is patterned by using, for example, the lithography method and the dry etching method. The upper electrode M2 is formed by the patterned conductor film 17.

Subsequently, a fourth insulating film 18 is formed on the entire main surface of the semiconductor substrate 11 so as to cover the upper electrode M2. The fourth insulating film 18 is made of, for example, a silicon nitride film and can be formed by using, for example, the plasma CVD method. Also, the thickness of the fourth insulating film can be, for example, about 0.5 μm.

Next, holes (opening parts) 20 which reach the sacrifice film pattern 15A and expose part of the sacrifice film pattern 15A are formed in the third insulating film 16 and the fourth insulating film 18 by using, for example, the lithography method and the dry etching method. The holes 20 are formed at the positions planarly overlapped with the sacrifice film pattern 15A, and part of the sacrifice film pattern 15A is exposed from the bottom of the holes 20.

Next, as shown in FIG. 7, the sacrifice film pattern 15A is selectively etched through the holes 20 by using, for example, the dry etching method using xenon fluoride ($XeF_2$). By this means, the sacrifice film pattern 15A is selectively removed, and the region in which the sacrifice film pattern 15A was present becomes the cavity part 15, and the cavity part 15 is formed between the second insulating film 14 and the third insulating film 16. Alternatively, the cavity part 15 can be formed by removing the sacrifice film pattern 15A by, for example, the dry etching method using $ClF_3$ instead of the dry etching method using xenon fluoride ($XeF_2$). As a result, the cavity part 15 is formed above the lower electrode M1 so as to be overlapped with the lower electrode M1 when viewed from the upper surface, and the upper electrode M2 is formed above the cavity part 15 so as to be overlapped with the cavity part 15 when viewed from the upper surface.

Next, a fifth insulating film 19 is formed on the entire main surface of the semiconductor substrate 11 (in other words, on the fourth insulating film 18). By this means, part of the fifth insulating film 19 can be filled in the holes 20 so as to fill the holes 20. The fifth insulating film 19 is made of, for example, a silicon nitride film and can be formed by using, for example, the plasma CVD method. The thickness of the fifth insulating film 19 can be, for example, about 0.8 μm. A membrane M vibrated when the CMUT drives is made up of the third insulating film 16, the upper electrode M2, the fourth insulating film 18 and the fifth insulating film 19 positioned above the cavity part 15.

Next, mainly in order to restore a defect caused by insulation breakdown of the second insulating film 14 and the third insulating film 16 between the upper electrode M2 and the lower electrode M1 after the CMUT chip is repeatedly operated, detection of a defective CMUT cell and removal of the upper electrode M2 of the detected defective CMUT cell are carried out before forming a polyimide film to be a protective film. Hereinafter, a method of detecting the defective CMUT cell and a method of removing the upper electrode M2 of the defective CMUT cell will be described.

First, after the membrane M is repeatedly vibrated under predetermined conditions, the breakdown voltages of the second insulating film 14 and the third insulating film 16 between the upper electrode M2 and the lower electrode M1 are measured.

FIG. 8 is a graph chart showing an example of the breakdown characteristics of the insulating films (the second insulating film 14 and the third insulating film 16) between the upper electrode M2 and the lower electrode M1 measured in the CMUT cell C shown in FIG. 7 described above. The vertical axis of FIG. 8 represents the relative cumulated frequency of insulation breakdown, and the horizontal axis thereof represents the breakdown voltage.

A DC voltage of, for example, 100 V is applied to the lower electrode M1 and an AC voltage of, for example, 60 V in amplitude (120 V in peak-to-peak) is applied to the upper electrode M2, thereby repeatedly vibrating the membrane M $1\times10^{10}$ times. Then, the lower electrode M1 is set to be at the ground potential, a DC voltage is applied to the upper electrode M2, and the breakdown voltages of the second insulating film 14 and the third insulating film 16 between the upper electrode M2 and the lower electrode M1 are measured for each of the blocks B (this test is referred to as an AC stress test). Note that, before repeatedly vibrating the membrane M, by applying a DC voltage of 200 V between the upper electrode M2 and the lower electrode M1 for 10 seconds, the second insulating film 14 and the third insulating film 16 between the upper electrode M2 and the lower electrode M1 are confirmed to have no leakage.

As shown in FIG. 8, in most of the measured blocks B, the breakdown voltage between the upper electrode M2 and the lower electrode M1 is 270 V or higher, but the breakdown voltage is reduced to 170 V in one block B. There is a tendency that such abnormal blocks B whose breakdown voltages are reduced are increased as the number of times of vibrations is increased. However, it reaches saturation at $1\times10^{10}$ times, and a big difference is not found in the defect rate even when the vibrations are repeated more than that number of times.

When the block B whose breakdown voltage is reduced is observed by an optical microscope after the membrane M is repeatedly vibrated (after the AC stress test), it is confirmed that insulation breakdown has occurred to cause short circuit between the upper electrode M2 and the lower electrode M1 and that part of the membrane XM of the defective CMUT cell XC is physically broken as shown in FIG. 9.

Next, the membrane of the defective CMUT cell is removed, thereby electrically separating the defective CMUT cell from the surrounding normal CMUT cells and restoring the block including the defective CMUT cell in which the insulation breakdown has occurred.

First, as shown in FIG. 10, the defective CMUT cell in which insulation breakdown has occurred is irradiated with, for example, an ultraviolet pulse laser having a wavelength of 355 nm and a pulse width of 3 ns, thereby removing the fourth insulating film 18 and the fifth insulating film 19 present above the upper electrode M2. At this time, the laser is condensed in the region slightly larger than the upper electrode M2 (the region surrounded by a dotted line in FIG. 3 described above or the recessed part denoted by a reference numeral 22 of FIG. 10) to irradiate the region with the laser. The heating time by the laser irradiation is short, but the power density thereof reaches several-hundred $MW/cm^2$, and the part irradiated with the laser is evaporated at an explosive pace at the same time as the heating. Since the heating time is short, the heat is not transmitted to the part other than the part irradiated with the laser and evaporation does not occur therein.

Next, as shown in FIG. 11, the upper electrode M2 of the region which is approximately the same as the previously-removed part is evaporated and removed by using an ultraviolet pulse laser having the same wavelength. At this time, all or part of the spokes connected to the upper electrode M2 of the defective CMUT cell are removed. Since the laser transmits through the third insulating film 16, the cavity part 15 and the second insulating film 14 present below the upper electrode M2 immediately before the removal of the upper electrode M2 is finished, the lower electrode M1 below the cavity part 15 is somewhat melted in some cases. However, since the area through which the laser transmits is small, the other normal CMUT cells are not affected.

Then, as shown in FIG. 4 described above, the polyimide film 21 serving as a protective film having an insulating property is applied onto the entire main surface of the semiconductor substrate 11, thereby filing the recessed part 22 which is the part from which the upper electrode M2, the fourth insulating film 18 and the fifth insulating film 19 have been removed.

When a DC voltage of 200 V is applied between the upper electrode M2 and the lower electrode M1 for 10 seconds to check short circuit with respect to the block including the recovered CMUT cell RC, no leakage is observed. Then, the membrane M is repeatedly vibrated $1\times10^{10}$ times by applying a DC voltage of, for example, 100 V to the lower electrode M1 and applying an AC voltage of, for example, 60 V in amplitude (120 V in peak-to-peak) to the upper electrode M2 again, and the breakdown voltages of the second insulating film 14 and the third insulating film 16 between the upper electrode M2 and the lower electrode M1 are evaluated. As a result, the breakdown voltages are 270 V, and the breakdown voltages equivalent to those of the other blocks B can be obtained.

As described above, according to the first embodiment, before the polyimide film 21 serving as the protective film is formed, the membrane M is repeatedly vibrated to evaluate the breakdown voltage between the upper electrode M2 and the lower electrode M1, and the upper electrode M2 of the defective CMUT cell in which reduction in the breakdown voltage has occurred between the upper electrode M2 and the lower electrode M1 due to the repeated vibrations of the membrane M is removed in advance to cut off the electrical connection with the other normal CMUT cells, thereby preventing the reduction in the breakdown voltage between the upper electrode M2 and the lower electrode M1 after the repeated vibrations of the membrane M in the block B or channel including the defective CMUT cell. As a result, the production yield of the CMUT can be improved.

(Second Embodiment)

Figure 12:
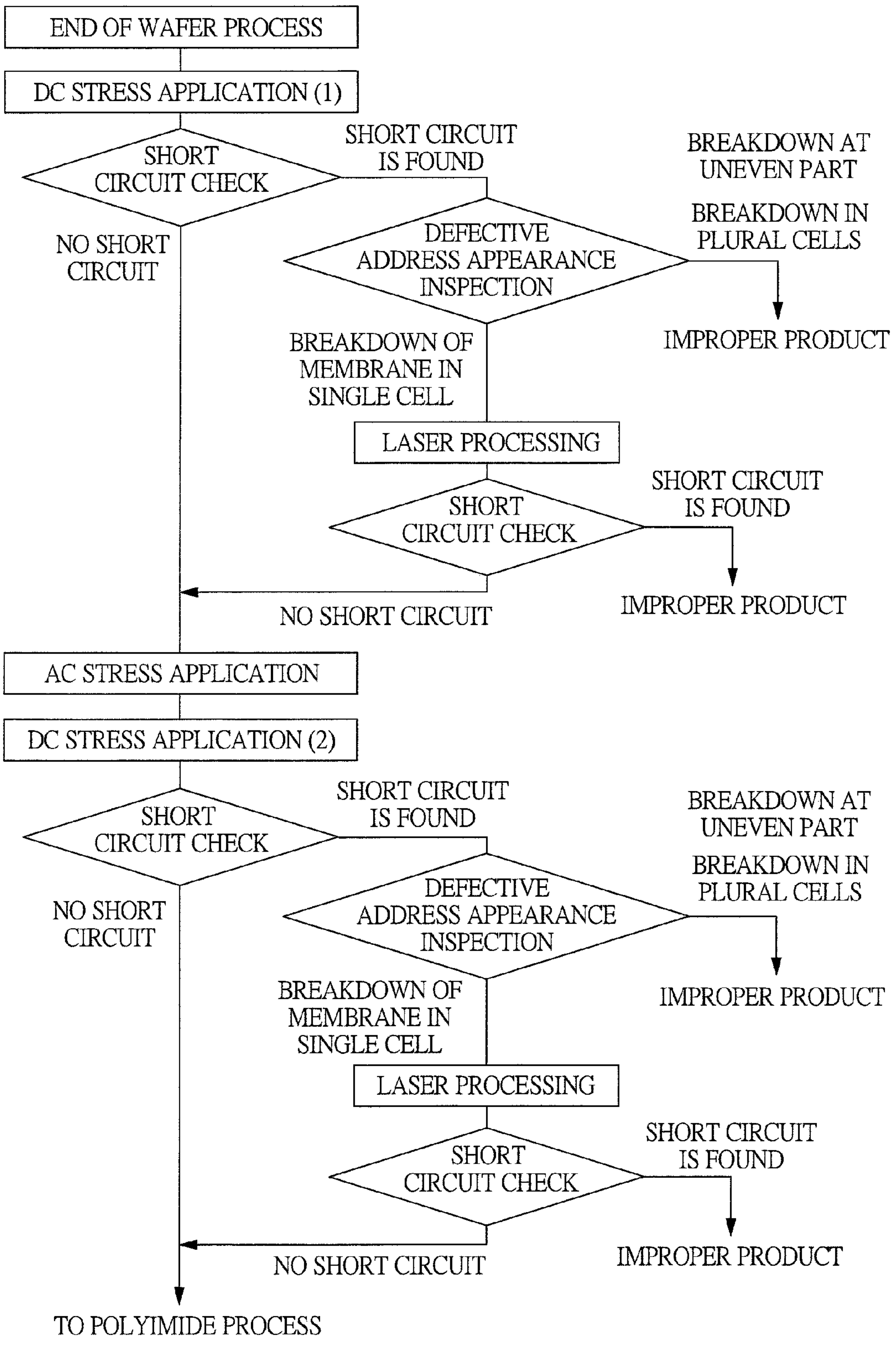
FIG. 12 is a flowchart for describing a discrimination test and a restoration sequence of a semiconductor chip mounted with a CMUT according to a second embodiment.

In the second embodiment, a series of procedures of discrimination of the defective CMUT cell in which the breakdown voltage between the upper electrode M2 and the lower electrode M1 is reduced due to the repeated vibrations of the membrane M and removal of the upper electrode M2 of the defective CMUT cell will be described. FIG. 12 shows a flowchart for describing a discrimination test and a restoration sequence of the semiconductor chip mounted with the CMUT according to the second embodiment.

First, a wafer process is finished in the step before the protective film (for example, the polyimide film 21 shown in FIG. 7 described above) of the CMUT cell is formed. Next, a DC voltage of, for example, 200 V is applied between the upper electrode M2 and the lower electrode M1 for 10 seconds (DC stress application (1)). Then, a voltage of, for example, 20 V is applied between the upper electrode M2 and the lower electrode M1 to check the short circuit between the upper electrode M2 and the lower electrode M1. If there is short circuit, the appearance of the short-circuited portion (defective address) is observed by using, for example, an optical microscope. If the short-circuited portion is observed as a result at an uneven part of the lower electrode M1, insulation breakdown has occurred among the plurality of mutually-adjacent blocks B and restoration thereof is difficult, and therefore, the semiconductor chip in which the short circuit is confirmed is determined as an improper product. If insulation breakdown is confirmed in a plurality of the CMUT cells even in the case where the short-circuited portion is observed in the membrane M, a lacked part in an image may be caused in the image diagnosis when the upper electrode M2 is removed by laser irradiation. Therefore, the semiconductor chip in which the short circuit is confirmed is determined to be an improper product. In the case where the short-circuited portion is observed in the membrane M and insulation breakdown is confirmed in one CMUT cell, there is a possibility that the channel including the defective CMUT cell can be restored by removing the upper electrode M2. Therefore, the process proceeds to the next laser processing step.

Next, as described in the first embodiment above, the defective CMUT cell in which insulation breakdown has occurred is irradiated with pulse laser, thereby removing the upper electrode M2 constituting the defective CMUT cell and the insulating films (for example, the fourth insulating film 18 and the fifth insulating film 19 shown in FIG. 7) thereabove.

Then, a DC voltage is applied between the upper electrode M2 and the lower electrode M1. If there is short circuit, the semiconductor chip is determined to be an improper product which cannot be restored. If there is no short circuit, the process proceeds to the next AC stress application step.

In the AC stress application step, as described in the first embodiment above, a DC voltage of, for example, 100 V is applied to the lower electrode M1, and an AC voltage of, for example, 60 V in amplitude (120 V in peak-to-peak) is applied to the upper electrode M2, thereby repeatedly vibrating the membrane M, for example, $1\times10^{10}$ times. This test is carried out in units of channel or block.

After the AC stress application, a DC voltage of, for example, 200 V is applied again between the upper electrode M2 and the lower electrode M1 for 10 seconds (DC stress application (2)). Then, a voltage of, for example, 20 V is applied between the upper electrode M2 and the lower electrode M1 to check the short circuit between the upper electrode M2 and the lower electrode M1. In the AC stress application, if the upper electrode M2 and the lower electrode M1 of the membrane M are strongly vibrated compared with the other CMUT cells, insulation breakdown occurs in the DC stress application (2), or a large leakage compared with the other CMUT cells is measured in the short-circuit check.

If the insulation breakdown occurs in the AC stress application or if short circuit is present after the DC stress application (2), the appearance of the short-circuited portion (defective address) is observed by using, for example, an optical microscope. As a result, if the short-circuited portion is observed at an uneven part of the lower electrode M1, insulation breakdown has occurred in the plurality of mutually-adjacent blocks B and restoration thereof is difficult, and therefore, the semiconductor chip in which the short circuit is confirmed is determined to be an improper product. If insulation breakdown is confirmed in a plurality of the CMUT cells even in the case where the short-circuited portion is observed at the membrane M, a lacked part in an image may be caused in the image diagnosis when the upper electrode M2 is removed by laser irradiation. Therefore, the semiconductor chip in which the short circuit is confirmed is determined to be an improper product. In the case where the short-circuited portion is observed in the membrane M and insulation breakdown is confirmed in one CMUT cell, there is a possibility that the channel including the defective CMUT cell can be restored by removing the upper electrode M2. Therefore, the process proceeds to the next laser processing step.

Next, as described in the first embodiment above, the defective CMUT cell in which the insulation breakdown has occurred is irradiated with the pulse laser to remove the upper electrode M2 constituting the defective CMUT cell and the insulating film (for example, the fourth insulating film 18 and the fifth insulating film 19 shown in FIG. 7) thereabove.

Then, a DC voltage is applied between the upper electrode M2 and the lower electrode M1. If there is short circuit, the semiconductor chip is determined to be an improper product. If there is no short circuit, the semiconductor chip is determined to be a proper product, and the process proceeds to the next deposition and patterning step of the protective film. The CMUT cell from which the upper electrode M2 is removed by laser irradiation through the above-described steps has the cross-sectional shape as shown in FIG. 4 described above.

As described above, according to the second embodiment, the abnormal defective CMUT cell in which the breakdown voltage between the upper electrode M2 and the lower electrode M1 is reduced due to the repeated vibrations of the membrane M can be detected by the wafer test process and can be recovered. Therefore, the manufacturing yield of the semiconductor device mounted with the CMUT can be improved.

Next, the case where the CMUT which has undergone the test according to the second embodiment is applied to, for example, an ultrasonic diagnostic apparatus will be described.

Figure 13:
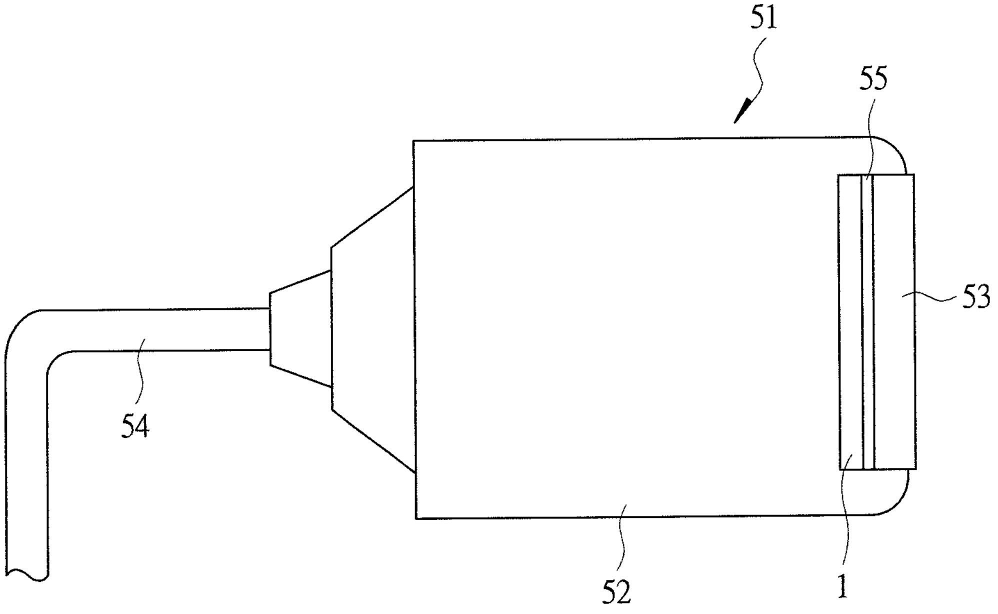
FIG. 13 is an explanatory drawing of a probe of an ultrasonic diagnostic apparatus to which the CMUT according to the second embodiment of the present invention is applied.

The ultrasonic diagnostic apparatus is a medical diagnostic apparatus utilizing permeability of acoustic waves, by which the interior of a living body which cannot be seen from outside can be visualized by imaging it in real-time by using ultrasonic waves exceeding the audible range. FIG. 13 shows an external view of a probe of the ultrasonic diagnostic apparatus.

The probe 51 is a transmitting/receiving unit of ultrasonic waves. As shown in FIG. 13, the above-described semiconductor chip 1 is attached to the distal end surface of a probe case 52 forming the probe 51, with the main surface of the chip being directed toward the outside. Furthermore, an acoustic lens (acoustic surface protecting layer) 53 is attached to the main surface side of the semiconductor chip 1. The semiconductor chip 1 is connected to a main system of diagnostic apparatus via a cable 54. An electric shield layer 55 is disposed between the acoustic lens 53 and the semiconductor chip 1. The electric shield layer 55 has a structure in which a metal film is sandwiched by insulating films and has a shielding function so that voltages are not applied to the human body when the insulating film on the electrode or bonding is broken. In the present invention, after the membrane is repeatedly vibrated, the upper electrode of the CMUT cell in which insulation breakdown has occurred at the membrane is completely removed, and the insulating film is formed at the removed part. Therefore, in the CMUT cell in which insulation breakdown has occurred at the membrane, short circuit between the upper electrode and the electric shield layer 55 does not occur.

In ultrasonic diagnosis, after the head (the acoustic lens 53 side) of the probe 51 is caused to abut the body surface (surface of the body), scanning is carried out while gradually shifting the position thereof little by little. At this time, ultrasonic pulses of several MHz are transmitted into the living body from the probe 51 abutting the body surface, and reflected waves from the tissues having different acoustic impedances are received. In this manner, cross-sectional images of the living tissues are obtained and the information about the target part can be known. The distance information of reflectors can be obtained by the time interval from transmission to reception of the ultrasonic waves. In addition, the information about the presence or quality of the reflectors can be obtained from the level or outer shape of the reflected waves.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in the first embodiment, the repeated vibration test of the membrane M is carried out after formation of the fifth insulating film 19, and removal of the upper electrode M2; the fourth insulating film 18 and the fifth insulating film 19 is carried out with respect to the CMUT cell in which the breakdown voltage of the second insulating film 14 or the third insulating film 16 between the upper electrode M2 and the lower electrode M1 is reduced, and then, the polyimide film 21 is formed. However, the repeated vibration test of the membrane M may be carried out after formation of the polyimide film 21. In this case, in the CMUT cell in which the breakdown voltage of the second insulating film 14 or the third insulating film 16 between the upper electrode M2 and the lower electrode M1 is reduced, the polyimide film on the fifth insulating film 19 has to be first removed by laser irradiation. Furthermore, since a protective film having an insulating property has to be formed at the removed part, a polyimide film is formed again. Therefore, the film thickness of the two layers of the polyimide films has to be adjusted so that the vibrations of the membranes M of the CMUT cells in which removal is not carried out achieve a desired value.

Moreover, in the first embodiment, the polyimide film 21 is formed as the uppermost layer of the CMUT cell. However, the film is not limited thereto as long as the film has an insulating property and functions as a protective film. Examples of the materials which replace the polyimide film 21 include a silicon oxide film, a silicon nitride film and a parylene film.

Moreover, the structure and materials of the CMUT cells described in the first embodiment show one of the combinations thereof. For example, the shape of the CMUT cell shown in the first embodiment is hexagonal, but the shape is not limited thereto and may be, for example, circular or tetragonal. Also, the insulating films (the second insulating film 14 and the third insulating film 16) are disposed both between the lower electrode M1 and the cavity part 15 and between the upper electrode M2 and the cavity part 15, but only either one of the insulating films may be provided.

Moreover, the first embodiment has been described based on an example of a so-called 1.5D-type array in which the lower electrode M1 is divided in the first direction X and extend in the second direction Y orthogonal thereto. However, the array is not limited thereto and may be, for example, a 1D-type cell array in which the lower electrode M1 is not divided in the semiconductor chip 1. In this case, a silicon substrate may be used for the lower electrode M1 instead of an electrically conductive film. Alternatively, the cell array may be a 2D-type cell array in which the lower electrode M1 is divided for each block B and a voltage can be independently applied. Also, the positions of M1 and M2 in a vertical direction may be switched to each other.

Moreover, in the second embodiment described above, in the test and product discrimination of the semiconductor chip mounted with the CMUT, the semiconductor chip is discriminated to be an improper product when breakdown is observed in a plurality of CMUT cells in the short circuit check. However, if the breakdown is at the level that does not cause problems to diagnosis images, the semiconductor chip can be determined to be a proper product even if the plurality of CMUT cells are broken.

Furthermore, in the second embodiment described above, the repeated vibration test of the membrane M is carried out in the state of a wafer, the breakdown voltages of the insulating films between the upper electrode M2 and the lower electrode M1 are checked, and then the CMUT cell whose breakdown voltage is reduced is recovered. However, the series of test and recovering steps may be carried out in the state of a chip after dicing of the wafer or may be carried out in the state where the chip is mounted on the probe of the ultrasonic diagnostic apparatus. When the series of test and recovering steps are carried out in the state where the chip is mounted on the probe of the ultrasonic diagnostic apparatus, since it is difficult to observe the appearance of defective portions and recover the defective portions by laser irradiation after the acoustic lens is adhered thereto, the observation and the recovery are desired to be carried out in a step before adhesion of the acoustic lens.

Also, in the above-described first and second embodiments, the removal is carried out by irradiating the CMUT cell, in which the breakdown voltage of the second insulating film 14 or the third insulating film 16 between the upper electrode M2 and the lower electrode M1 is reduced, with pulse laser. However, the removal may be carried out by using focused ion beam (FIB) instead of the laser.

In addition, in the above-described first and second embodiments, the case where the semiconductor chip 1 mounted with the CMUT is applied to the probe of the medical ultrasonic diagnostic apparatus is shown as an example. Therefore, the CMUT cell has both of the functions of transmission and reception of ultrasonic waves. However, the invention of the present application is not limited to this, and the CMUT cell may have only one of the functions of transmission and reception. Moreover, the semiconductor chip 1 mounted with the CMUT is not limited to medical use, but may be applied to other equipment which transmits, receives, or transmits and receives ultrasonic waves such as non-destructive inspection apparatuses, ultrasonic microscopes and ultrasonic flowmeters.

Industrial Applicability

The present invention can be used in, for example, various medical diagnosis equipment using an ultrasonic probe, an apparatus for inspecting defects in machines, various imaging equipment systems using ultrasonic waves (detection of obstacles and the like), a position detecting system, a temperature distribution measuring system and a flow rate measuring system.

Description Of Reference Numerals

1: semiconductor chip
11: semiconductor substrate
12: first insulating film

13: conductor film
14: second insulating film
15: cavity part
15A: sacrifice film pattern
16: third insulating film
17: conductor film
18: fourth insulating film
19: fifth insulating film
20: hole (opening part)
21: polyimide film
22: recessed part
51: probe
52: probe case
53: acoustic lens (acoustic surface protecting layer)
54: cable
55: electric shield layer
B: block
C: CMUT cell (ultrasonic element, vibrator, sensor cell)
CA: CMUT cell array region
Cb: CMUT cell
CHA: upper electrode channel
M: membrane
M1: lower electrode
M2: upper electrode
P1, P2: pad
RB: block including recovered CMUT cell
RC: recovered CMUT cell
RCH: upper electrode channel including recovered CMUT cell
SP: spoke
XC: defective CMUT cell
XM: membrane

The invention claimed is:

1. A manufacturing method of an ultrasonic probe for forming an ultrasonic probe mounted with a semiconductor device, in which an element having an upper electrode mechanically operated when a potential difference is applied between the upper electrode and a lower electrode disposed via a cavity part serves as one cell, blocks each including a predetermined number of the cells disposed in a first direction and a second direction orthogonal to the first direction are provided on a main surface of a semiconductor substrate, the upper electrodes of the plurality of cells constituting the blocks disposed in the first direction are electrically connected to each other by spokes, the lower electrodes of the plurality of cells constituting the blocks disposed in the second direction are electrically connected to each other, and the blocks are disposed in a matrix in the first direction and the second direction, the manufacturing method comprising:

(a) a step of measuring a breakdown voltage between the upper electrode and the lower electrode after operating the upper electrode;

(b) a step of removing the upper electrode of the cell determined to be defective in the step (a); and (c) a step of forming a protective film on the main surface of the semiconductor substrate after the step (b).

2. The manufacturing method of the ultrasonic probe according to claim 1, wherein the cavity part is formed above the lower electrode so as to be overlapped with the lower electrode, and the upper electrode is formed above the cavity part so as to be overlapped with the cavity part.

3. The manufacturing method of the ultrasonic probe according to claim 1, wherein an insulating film is formed at least either between the lower electrode and the cavity part or between the cavity part and the upper electrode.

4. The manufacturing method of the ultrasonic probe according to claim 1, wherein, in the step (b), all or part of the spokes connected to the upper electrode of the cell determined to be defective are removed.

5. The manufacturing method of the ultrasonic probe according to claim 1, further comprising: before the step (a), (d) a step of forming an insulating film covering the upper electrode on the main surface of the semiconductor substrate, wherein, in the step (b), after the insulating film formed in the step (d) is removed, the upper electrode of the cell determined to be defective and all or part of the spokes connected to the upper electrode of the cell determined to be defective are removed.

6. The manufacturing method of the ultrasonic probe according to claim 1, wherein, in the step (b), one of the cells is removed.

7. The manufacturing method of the ultrasonic probe according to claim 1, wherein, in the step (b), the upper electrode of the cell determined to be defective is removed by either pulse laser or focused ion beam.

8. The manufacturing method of the ultrasonic probe according to claim 1, wherein removal of the upper electrode of the cell determined to be defective in the step (b) is carried out in a wafer state, a chip state or in a state of being mounted on a probe of an ultrasonic diagnostic apparatus.

9. The manufacturing method of the ultrasonic probe according to claim 1, wherein, in the step (a), after the upper electrode is repeatedly vibrated by applying a DC voltage to the lower electrode and applying an AC voltage to the upper electrode, the breakdown voltage between the upper electrode and the lower electrode is measured by applying a DC voltage between the upper electrode and the lower electrode.

10. The manufacturing method of the ultrasonic probe according to claim 1, further comprising, after the step (c), (e) a step of applying a DC voltage between the upper electrode and the lower electrode to inspect presence of short circuit between the upper electrode and the lower electrode.

11. The manufacturing method of the ultrasonic probe according to claim 1, wherein the protective film is a polyimide film, a silicon oxide film, a silicon nitride film or a parylene film.

12. The manufacturing method of the ultrasonic probe according to claim 1, wherein the protective film is an insulating film made up of one layer or two layers.

13. The manufacturing method of the ultrasonic probe according to claim 1, wherein the plurality of cells constituting the block constitute an array of an ultrasonic transducer which carries out at least either transmission or reception of an ultrasonic wave.

14. An ultrasonic probe mounted with a semiconductor device, in which an element having an upper electrode mechanically operated when a potential difference is applied between the upper electrode and a lower electrode disposed via a cavity part serves as one cell, blocks each including a predetermined number of the cells disposed in a first direction and a second direction orthogonal to the first direction are provided on a main surface of a semiconductor substrate, the upper electrodes of the plurality of cells constituting the blocks disposed in the first direction are electrically connected to each other by spokes, the lower electrodes of the plurality of cells constituting the blocks disposed in the second direction are electrically connected to each other, and the blocks are disposed in a matrix in the first direction and the second direction, wherein the upper electrode having insulation defect between itself and the lower electrode is removed, and a protective film formed on the main surface of the semiconductor substrate from which the upper electrode has been removed is provided.

15. The ultrasonic probe according to claim 14, wherein the cavity part is disposed between the upper electrode and the lower electrode so as to be overlapped with the upper electrode and the lower electrode.

* * * * *